(12) United States Patent
Tanaka

(10) Patent No.: US 9,116,174 B2
(45) Date of Patent: Aug. 25, 2015

(54) ELECTRICAL CONNECTING APPARATUS AND METHOD FOR ASSEMBLING THE SAME

(71) Applicant: Kabushiki Kaisha Nihon Micronics, Tokyo (JP)

(72) Inventor: Kentaro Tanaka, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 251 days.

(21) Appl. No.: 13/739,897

(22) Filed: Jan. 11, 2013

(65) Prior Publication Data

US 2013/0207683 A1  Aug. 15, 2013

(30) Foreign Application Priority Data

Feb. 14, 2012  (JP) ................................. 2012-029211

(51) Int. Cl.
| | |
|---|---|
| *G01R 31/00* | (2006.01) |
| *G01R 1/073* | (2006.01) |
| *H01R 43/00* | (2006.01) |
| *H01R 12/70* | (2011.01) |
| *H01R 12/71* | (2011.01) |
| *H01R 13/621* | (2006.01) |

(52) U.S. Cl.
CPC ............ *G01R 1/073* (2013.01); *G01R 1/07378* (2013.01); *H01R 12/7082* (2013.01); *H01R 12/714* (2013.01); *H01R 43/00* (2013.01); *G01R 1/07342* (2013.01); *H01R 13/6215* (2013.01); *Y10T 29/49208* (2015.01)

(58) Field of Classification Search
CPC ... G01R 1/073; H01R 12/714; H01R 13/6215
USPC ............ 324/756.01–757.02, 754.09, 762.04, 324/425, 437, 754.07, 755.01, 758.01, 724
See application file for complete search history.

(56) References Cited

U.S. PATENT DOCUMENTS

| | | | |
|---|---|---|---|
| 6,104,615 A * | 8/2000 | Pohl et al. ..................... | 361/719 |
| 6,896,171 B2 | 5/2005 | Den Boer et al. | |
| 7,295,279 B2 | 11/2007 | Byun et al. | |
| 2012/0120611 A1* | 5/2012 | Ni et al. ........................ | 361/727 |

FOREIGN PATENT DOCUMENTS

| | | |
|---|---|---|
| CN | 1672056 A | 9/2005 |
| JP | 2008-134169 | 6/2008 |

(Continued)

*Primary Examiner* — Vincent Q Nguyen
*Assistant Examiner* — Trung Nguyen
(74) *Attorney, Agent, or Firm* — Ingrassia Fisher & Lorenz, P.C.

(57) ABSTRACT

An electrical connecting apparatus includes a wiring base plate having a first surface coupled with a reinforcing plate and provided on an opposite surface with first electrical connection portions, a probe base plate provided on a first surface with second electrical connection portions corresponding to the first electrical connection portions and provided on a second surface with probes electrically connected to the second electrical connection portions, anchor portions formed on the first surface of the probe base plate and provided with screw holes, cylindrical spacers having first ends removably coupled with the anchor portions, having screw grooves, and passing through the wiring base plate and the reinforcing plate, reference plates having reference planes to receive the spacers and removably coupled with the reinforcing plate, shims inserted between the respective reference plates and the reinforcing plate, and bolt screwed in the screw groove of the spacer.

5 Claims, 5 Drawing Sheets

(56) References Cited

FOREIGN PATENT DOCUMENTS

| TW | 1233490 B | 6/2005 |
| TW | 200624562 | 7/2006 |
| TW | 201019052 A | 5/2010 |

* cited by examiner

ELECTRICAL CONNECTING APPARATUS AND METHOD FOR ASSEMBLING THE SAME

RELATED APPLICATION

This application claims the benefit of, and claims priority to, Japanese patent application number 2012-029211, filed on Feb. 14, 2012.

TECHNICAL FIELD

The subject matter relates to an electrical connecting apparatus such as a probe card for use in electrical connection between a device under test such as an integrated circuit and a tester performing an electrical test of the device under test for an electrical test of an electrical circuit and a method for assembling the same.

BACKGROUND

A conventional electrical connecting apparatus A of this kind includes a wiring base plate 1 made of, e.g., a printed circuit board (PCB) and a probe base plate 2 arranged to be spaced from a lower surface of the wiring base plate and provided on a lower surface thereof which is an opposite side of a surface opposed to the wiring base plate 1 with multiple probes 2a as illustrated in FIG. 5 (for example, refer to Patent Literature 1). Between the wiring base plate 1 and the probe base plate 2 is arranged an interposer 3 made of an elastic connector such as a pogo pin assembly, and the respective probes 2a of the probe base plate 2 are electrically connected to sockets (not illustrated) provided on the wiring base plate 1 via the interposer. The electrical connecting apparatus is connected to a tester main body (not illustrated) at the sockets. On an upper surface of the wiring base plate 1 is provided a reinforcing plate 4 adapted to restrict warpage of the wiring base plate 1. The reinforcing plate 4, the wiring base plate 1, the interposer 3, and the probe base plate 2 are coupled integrally by tightening of bolts 5 to be inserted from a side of the reinforcing plate 4.

More specifically, tip ends of the bolts 5 inserted from an upper surface of the reinforcing plate 4 are screwed in anchor portions 2b provided on the probe base plate 2 and are tightened. Also, cylindrical spacer members 6 are attached to the bolts 5 and determine a height position of a virtual plane P on which probe tip positions of the respective probes 2a are aligned in cooperation with the anchor portions 2b in which the tip ends of the bolts 5 are screwed when the bolts 5 are tightened.

In an electrical test of a device under test 7 with use of the electrical connecting apparatus A such as a probe card, an edge portion of the wiring base plate 1 is mounted on an upper surface of an edge portion of a card holder 8 provided in a test head of the not illustrated tester, and probe tips of the respective probes 2a abut on corresponding electrodes 7a of the device under test 7 on a stage Y. At this time, in order for the respective probes 2a to contact the corresponding electrodes 7a with uniform and appropriate thrusting forces, a length L3 of each spacer member 6 is selected in accordance with a manufacturing error of a thickness dimension L1 of the wiring base plate 1, for example, so that a distance from the upper surface of the edge portion of the card holder 8 to the virtual plane P on which the probe tips of the respective probes 2a are aligned may be a predetermined value L.

Also, by thickness adjustment of a shim 9 to be inserted between the wiring base plate 1 and the reinforcing plate 4, the height position of the virtual plane P on which the probe tips of the respective probes 2a are aligned is finely adjusted.

CITATION LIST

Patent Literature 1: Japanese National Patent Appln. Public Disclosure No. 2008-134169

SUMMARY

Meanwhile, when at least one of the multiple probes 2a of the electrical connecting apparatus A is defective to cause a problem for normal use of the electrical connecting apparatus A, for example, the probe base plate 2 in which the probe 2a is defective needs to be replaced with a new probe base plate 2 provided with defect-free probes 2a.

In the conventional electrical connecting apparatus A, when the bolts 5 are released from the anchor portions 2b for replacement of the probe base plate 2, assembling of the wiring base plate 1, the shim 9, and the reinforcing plate 4 is cancelled. Thus, in order to achieve the predetermined virtual plane P by incorporating the new probe base plate 2, the predetermined value L needs to be set correctly again in a state in which the new probe base plate 2 is incorporated. For setting of this predetermined value L, a spacer member 6 having an appropriate length L3 needs to be selected in accordance with a height dimension L2 of each anchor portion 2b of the new probe base plate 2 by trial and error, then for fine adjustment, a shim 9 having an appropriate thickness needs to be selected by trial and error, and the bolts 5 need to be coupled with the corresponding anchor portions 2b with appropriate tightening forces in the combined state.

Such a trial and error work of fine adjustment of the virtual plane P by selection of each spacer member 6 having an appropriate length and selection of the shim 9 requires a user to do a troublesome and fine determination work. Thus, even when the new probe base plate 2 is received, a replacement work of the probe base plate 2 is not easy.

Accordingly, when the probes 2a are defective, the user returns the entire probe card A to a manufacturer without disassembling the probe card A, and the manufacturer does replacement of the probe base plate 2 and the aforementioned adjustment work.

An electrical connecting apparatus is provided which dispenses with a troublesome adjustment work requiring skill including selection of a shim and cylindrical spacers at the time of replacement of a probe base plate, and a method for assembling the same is provided.

An electrical connecting apparatus according to an embodiment includes a reinforcing plate having a first surface and a second surface opposed to each other; a wiring base plate having a first surface, a second surface and a plurality of first electrical connection portions provided on the second surface of the wiring base plate, said wiring base plate being coupled with the reinforcing plate so that the first surface of the wiring base plate abuts on the first surface of the reinforcing plate; a probe base plate having a first surface opposed to the second surface of the wiring base plate, a second surface, second electrical connection portions and multiple probes, the second electrical connection portion being provided on the first surface of the probe base plate and corresponding to the first electrical connection portions, the multiple probes, respectively, being electrically connected to the second electrical connection portions; a plurality of anchor portions respectively formed in an area of the first surface of the probe base plate not provided with the second electrical connection portions and respectively provided with screw holes to be opened to top surfaces thereof; a plurality of through holes formed respectively in the wiring base plate and the reinforcing plate to correspond to the respective anchor portions to be aligned with each other in plate thickness directions of the wiring base plate and the reinforcing plate; a plurality of cylindrical spacers respectively having first ends thereof removably screw-coupled with the top surfaces of the respective corresponding anchor portions, respectively having screw grooves formed on inner circumferential surfaces of second ends thereof, and respectively arranged in the through holes of the wiring base plate and the reinforcing plate; a plurality of reference plates arranged on the second surface of the reinforcing plate to correspond to the respective cylindrical spacers, respectively having reference planes adapted to receive the second ends of the respective corresponding cylindrical spacers on surfaces thereof opposed to the second surface of the reinforcing plate, and respectively removably coupled with the reinforcing plate via screw members; a plurality of shims inserted between the respective reference plates and the reinforcing plate; and at least one bolt having a head portion mounted on a second surface of the reference plate and a shaft portion passing through the reference plate and the corresponding shim from the head portion and having a tip end portion thereof screwed in the screw groove of the cylindrical spacer.

An edge portion on the second surface of the wiring base plate can be mounted on an edge portion upper surface of an annular card holder of a test head, and the respective cylindrical spacers can be selected so that a distance between a virtual plane on which probe tips of the probes are aligned and the first surface of the wiring base plate may be kept to be a predetermined value.

The shims can undergo selection of each thickness dimension thereof or a piling count for fine adjustment of a distance from the first surface of the wiring base plate to the virtual plane on which the probe tips of the probes are located and correction of inclination of the virtual plane with respect to the upper surface of the card holder.

The first end of the cylindrical spacer can be provided with a male screw portion projecting from an end surface thereof in an axial direction of the cylindrical spacer, and the male screw portion can be screwed in the screw hole of the corresponding anchor portion so as to allow the end surface to abut on the top surface of the anchor portion.

Between the second surface of the wiring base plate and the first surface of the probe base plate can be inserted an elastic connector adapted to electrically connect the mutually corresponding first and second electrical connection portions.

In a case where deformation in a thickness direction thereof is introduced in the probe base plate, and where the probe tips of the probes are arranged on the virtual plane in a state of holding the deformation of the probe base plate, the cylindrical spacers can hold the deformation of the probe base plate in cooperation with the anchor portions so as to hold the probe tips of the probes on the virtual plane.

A method for assembling the electrical connecting apparatus includes: after combining the reinforcing plate and the reference plate with the wiring base plate, prior to providing the cylindrical spacers in the through holes of the wiring base plate and the reinforcing plate and screwing the bolts into the cylindrical spacers, providing cylindrical standard spacer members having predetermined length dimensions in the respective through holes of the wiring base plate and the reinforcing plate and screwing the corresponding bolts into screw holes formed at first ends of the respective standard spacer members to tighten the bolts; after tightening the bolts, measuring height positions of second ends of the respective standard spacer members; when variation from an appropriate value exists in measurement values of the height positions of the second ends of the respective standard spacer members, providing the shims having appropriate thickness dimensions between the reinforcing plate and the reference plates to cancel the variation; after providing the shims, combining the reinforcing plate and the reference plates by the screw members; replacing the standard spacer members with the cylindrical spacers each having a length derived by subtracting a height of the corresponding anchor portion from a length of the standard spacer member and coupling the first ends of the cylindrical spacers with the corresponding anchor portions; and making the bolts pass through the reference plates and the corresponding shims so as to make the second ends of the cylindrical spacers abut on the reference planes of the reference plates and screwing the shaft portions of the bolts into the screw grooves of the second ends of the corresponding cylindrical spacers to combine the reinforcing plate, the wiring base plate, and the probe base plate with one another.

Prior to providing the standard spacer members, the shims can be provided between the reinforcing plate and the reference plates in advance, and when variation from the appropriate value exists in the height positions of the second ends of the standard spacer members after providing the standard spacer members, at least part of the shims can be replaced for selection of thickness dimensions of the shims to cancel the variation.

When variation exists in the measurement values of the height positions of the second ends of the standard spacer members, thickness dimensions of the respective shims can be selected so that the height positions of the second ends of the respective standard spacer members may be aligned with a highest height position of the second end of the standard spacer member.

The selection of the thickness dimensions of the shims can be done by selection of one shim having an appropriate thickness dimension to eliminate the variation.

The selection of the thickness dimensions of the shims can be done by selection of the plurality of shims having an appropriate total thickness dimension to eliminate the variation.

According to the embodiment, the shims can be set appropriately with use of the standard spacer members having predetermined lengths so that a distance from the reference plane of each reference plate to the second surface of the wiring base plate may be a predetermined value regardless of variation in thickness of the wiring base plate caused by a manufacturing error. The shims, which have been set appropriately, are held between the reference plates and the reinforcing plate by the screw members.

When the shims are held appropriately, each cylindrical spacer is selected so that the sum of a height of each anchor portion of the probe base plate and a length of the cylindrical spacer corresponding to the anchor portion may be equal to a length of the standard spacer member based on length information of the standard spacer member. The selected cylindrical spacers are tightened to the corresponding anchor portions of the probe base plate appropriately, are incorporated in the wiring base plate and the reinforcing plate together with the probe base plate, and can be tightened appropriately by screwing the bolts into the corresponding cylindrical spacers in this incorporation state. Accordingly, the electrical connecting apparatus can be assembled relatively easily without a conventional trial and error setting of the cylindrical spacers and the shims.

Also, as for setting of the shims, the respective shims are provided at a plurality of locations corresponding to the bolts, and thus by appropriately selecting thicknesses of the shims provided at the respective locations, relative inclination of both the surfaces of the wiring base plate caused by a manufacturing error of the wiring base plate can be corrected, for example.

Also, the shims, which have been set appropriately, are held between the reference plates and the reinforcing plate by the screw members as described above. Thus, even when the bolts are detached from the corresponding cylindrical spacers for replacement of the probe base plate, relationship of the reference planes of the reference plates with the reinforcing plate is maintained. Accordingly, by selecting as the cylindrical spacers to be provided to the respective anchor portions of a new probe base plate the cylindrical spacers each having a length which is equal to a length of the standard spacer member when it is added to a height of the corresponding anchor portion, attaching them to the corresponding anchor portions of the new probe base plate, and attaching them to the reinforcing plate and the wiring base plate in which the shims have been incorporated appropriately with use of the bolts, the electrical connecting apparatus in which the probe tips of the probes are aligned on an appropriate virtual plane can be reassembled relatively easily without the need for a conventional complicated adjustment work.

That is, after releasing coupling between the cylindrical spacers coupled with the anchor portions of the probe base plate and the bolts for replacement of the probe base plate, the cylindrical spacers each having a length derived by subtracting a height of the anchor portion of a new probe base plate from a predetermined length of the standard spacer member can be applied as the cylindrical spacers for the new probe base plate.

Thus, even when need of replacement of the probe base plate having defective probes arises in a user, the user does not need to return the electrical connecting apparatus to a manufacturer as in a conventional case, can select the appropriate cylindrical spacers selected based on the standard spacer members appropriately not by trial and error, and can reassemble the electrical connecting apparatus easily and appropriately by a reassembling work with use of the appropriate cylindrical spacers.

With the embodiment, it is possible to provide an electrical connecting apparatus which can be assembled without trial and error in appropriate setting of the shims and the cylindrical spacers as described above.

Also, since the user can incorporate the probe base plate having appropriate probes quickly without having trouble with appropriate setting of the shims and the cylindrical spacers as in a conventional case, the user does not need to return the electrical connecting apparatus to the manufacturer at every defect of the probe.

Further, with the embodiment, since the inclination of both the surfaces of the wiring base plate can be corrected by adjustment of the shims, planarity of the virtual plane on which the probe tips of the probes are aligned can be corrected more accurately.

DETAILED DESCRIPTION

Figure 1:
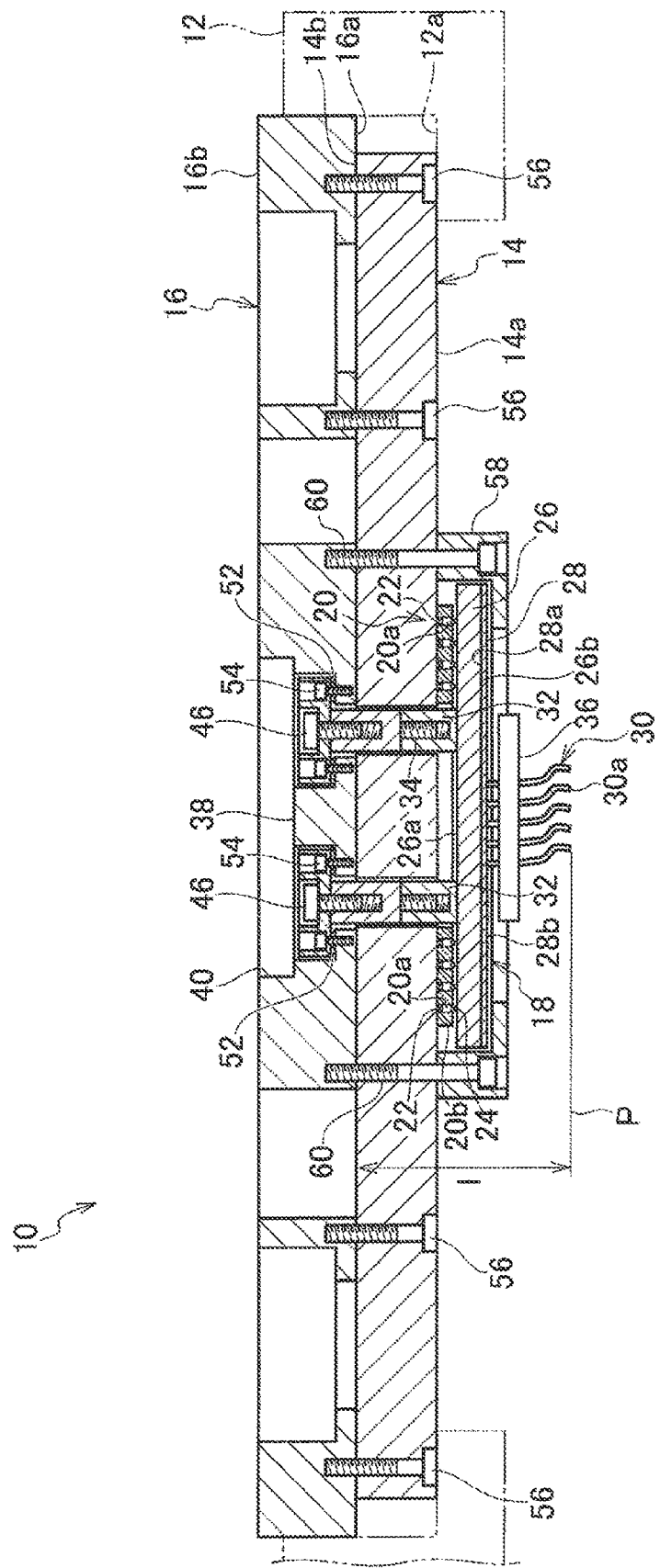
FIG. 1 is a cross-sectional view of an embodiment of an electrical connecting apparatus.
Figure 5:
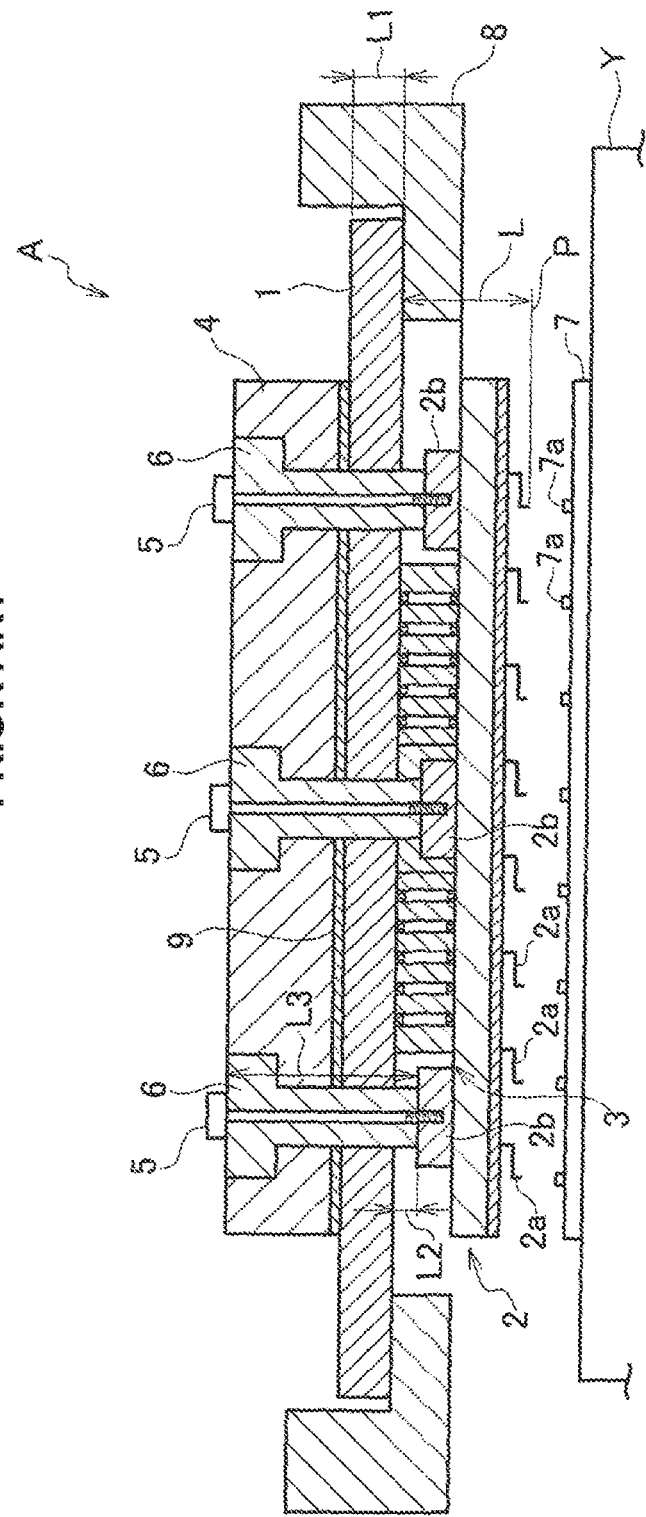
FIG. 5 is a cross-sectional view illustrating a conventional electrical connecting apparatus.

An electrical connecting apparatus 10 is illustrated in FIG. 1. This electrical connecting apparatus 10 is used in an electrical test of the semiconductor wafer 7 arranged on the conventionally well-known vacuum chuck Y constituting the stage of the tester, for example, as illustrated in FIG. 5. Multiple ICs are formed in the semiconductor wafer 7 although they are not illustrated in figures, and for an electrical test of these ICs, the electrical connecting apparatus 10 is used to connect respective connection pads of the ICs to electrical circuits of a tester main body (not illustrated) of the tester.

This electrical connecting apparatus 10 includes a circular flat-plate-like wiring base plate 14 having a lower surface 14a as an attaching surface to an annular card holder 12 provided to a tester head (not illustrated) of the tester, a circular flat-plate-like reinforcing plate 16 to be attached to an upper surface 14b of the wiring base plate, a probe base plate 18 arranged to be spaced from the lower surface 14a of the wiring base plate 14, and an elastic connector 20 arranged between the lower surface 14a of the wiring base plate 14 and an upper surface 18a of the probe base plate 18 opposed to the lower surface as illustrated in FIG. 1.

The wiring base plate 14 is made of a printed circuit board (PCB) similar to a conventional one, and in an area of the upper surface 14b exposed from the reinforcing plate 16 are arrayed and arranged multiple, not illustrated, and conventionally well-known sockets as electrical connection portions to the tester. In FIG. 1, the sockets are omitted for simplification of the drawing.

On the lower surface 14a of the wiring base plate 14 are formed first electrical connection portions 22 respectively corresponding to the respective sockets. The respective electrical connection portions 22 are connected to respective contact points of the corresponding sockets via conventionally well-known conductive paths (not illustrated) formed in the wiring base plate 14.

The probe base plate 18 includes a ceramic plate 26 arranged to be opposed to the wiring base plate 14 and a flexible wiring plate 28 connected to the ceramic plate in the example illustrated in FIG. 1. An upper surface 26a of the ceramic plate 26 is arranged to be opposed to the lower surface 14a of the wiring base plate 14 and thus constitutes an upper surface of the probe base plate 18 opposed to the wiring base plate 14. On this upper surface 26a are formed second electrical connection portions 24 corresponding to the electrical connection portions 22 of the wiring base plate 14.

The wiring plate 28 is arranged to connect an upper surface 28a thereof to a lower surface 26b of the ceramic plate 26, and thus a lower surface 28b thereof constitutes a lower surface of the probe base plate 18. On the lower surface of the probe base plate 18 or the lower surface 28b of the wiring plate 28 are provided multiple probes 30 corresponding to the connection pads 7a (refer to FIG. 5) of the semiconductor wafer 7 (refer to FIG. 5).

The ceramic plate 26 and the wiring plate 28 constituting the probe base plate 18 are provided with not illustrated conductive paths similar to conventional ones, and the respective probes 30 are connected to the corresponding second electrical connection portions 24 via the conductive paths. Also, in an area of the upper surface of the probe base plate 18 or the upper surface 26a of the ceramic plate 26 not provided with the second electrical connection portions 24 are erected to be spaced from one another anchor portions 32 each formed, e.g., in a cylindrical shape and each having a predetermined height dimension. On a top surface of each anchor portion 32 is opened a screw hole 34 extending in an axial direction of the anchor portion.

In the probe base plate 18, warpage in a plate thickness direction thereof or deformation in the plate thickness direction such as wave-like deformation is generally introduced since thermal or mechanical distortion stress is applied to the probe base plate 18 in a process of forming the aforementioned conductive paths and another process. Part of this deformation remains in the probe base plate 18 in a state in which no load is effected to the probe base plate 18. Probe tips 30a of the respective probes 30 are formed to be aligned on a virtual plane P in a state in which the remaining no-load deformation of the probe base plate 18 is held as illustrated in FIG. 1. Also, the top surfaces of the respective anchor portions 32 are desirably polished to be flat so that a virtual plane passing these top surfaces may be parallel to the virtual plane P with a predetermined space from the virtual plane P.

In the example illustrated in FIG. 1, a conventionally well-known holder 36 made of a non-conductive material and adapted to hold the probes 30 is attached to the respective probes 30 so as to allow the respective probes 30 to pass therethrough. Also, between the wiring base plate 14 and the probe base plate 18 is arranged the aforementioned elastic connector 20, and the elastic connector is a pogo pin assembly as one of conventionally well-known interposers in the example illustrated in FIG. 1. This pogo pin assembly 20 includes a pogo pin block 20a to be inserted between the wiring base plate 14 and the probe base plate 18 and a plurality of pogo pins 20b to be incorporated in the pogo pin block and electrically mutually connects the respective first electrical connection portions 22 to the corresponding second electrical connection portions 24.

The reinforcing plate 16 is arranged on the upper surface 14b of the wiring base plate 14 with a lower surface 16a thereof abutting on the upper surface 14b of the wiring base plate 14. At a center portion of an upper surface 16b opposed to and parallel to the lower surface 16a is formed a counter boring portion 40 having a flat bottom surface 38 in the example illustrated in the figure.

Figure 2:
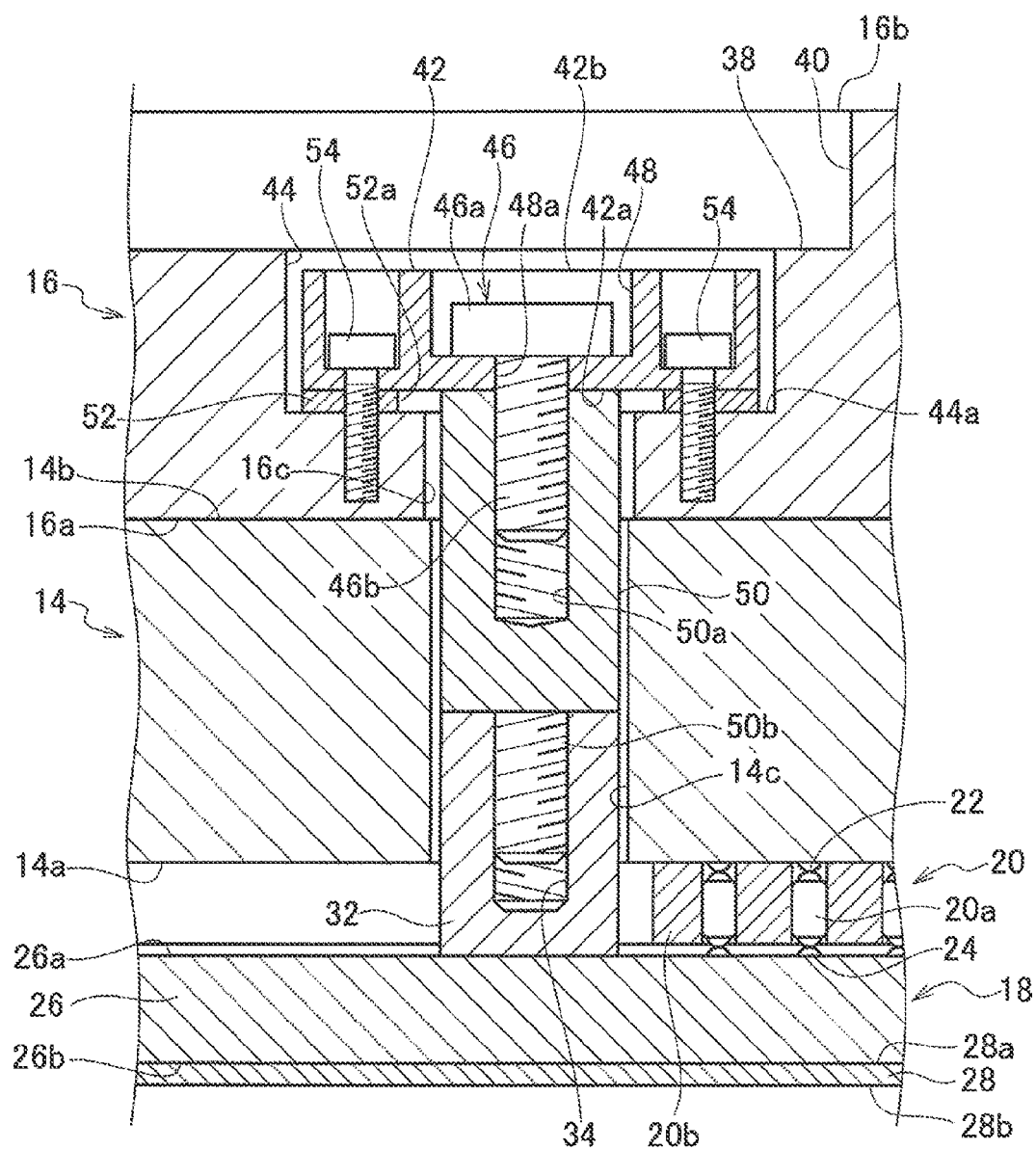
FIG. 2 is a partially enlarged cross-sectional view illustrating the electrical connecting apparatus illustrated in FIG. 1.

FIG. 2 illustrates an enlarged part of the counter boring portion 40. As illustrated in FIG. 2, on the bottom surface 38 of the counter boring portion 40 is formed a circular opening 44 adapted to receive a reference plate 42 formed, e.g., in a circular flat shape to correspond to each anchor portion 32. The reference plate 42 has a flat lower surface 42a and is arranged to make the lower surface face a bottom surface 44a of the opening 44. On an upper surface 42b of the reference plate 42 is formed a center recess portion 48 adapted to receive a head portion 46a of a bolt 46. In the center recess portion is formed a center opening 48a allowing a shaft portion 46b of the bolt 46 to pass therethrough.

In the wiring base plate 14 and the reinforcing plate 16 are formed through holes 14c and 16c adapted to receive the anchor portion 32 and an after-mentioned cylindrical spacer 50 in respective plate thickness directions so as to be aligned with each other. The through hole 16c of the reinforcing plate 16 is opened to the bottom surface 44a of the opening 44.

In the through holes 14c and 16c of the wiring base plate 14 and the reinforcing plate 16 is arranged the cylindrical spacer 50 having a horizontal cross-section formed, e.g., in a circular shape with an upper end thereof abutting on the lower surface 42a of each reference plate 42. At the upper end of the cylindrical spacer 50 is formed a screw groove 50a to be screwed by the shaft portion 46b of the bolt 46. Also, a lower end of the cylindrical spacer 50 abuts on the top surface of the anchor portion 32. On a lower end surface of the cylindrical spacer 50 is formed a male screw portion 50b projecting in an axial direction of the cylindrical spacer. The male screw portion 50b is screwed in the screw hole 34 of the anchor portion 32 so as to allow the lower end surface of the cylindrical spacer 50 to abut on the top surface of the anchor portion 32.

Between the bottom surface 44a of the reinforcing plate 16 and the lower surface 42a as a reference plane of the reference plate 42 is arranged a shim 52. In each shim 52 is formed an opening 52a making an axis thereof correspond to an axis of the center opening 48a. The opening 52a has a diameter which is large sufficient to receive the cylindrical spacer 50 so as to allow the upper end of the cylindrical spacer 50 to abut on the reference plane 42a of the reference plate 42. As such a shim 52, a conductive plate member such as a stainless steel plate or a non-conductive plate member such as a polyimide film having, e.g., a 100-μm thickness dimension can be used.

By screw members 54 to be inserted from the upper surface 42b of the reference plate 42 and screwed in the reinforcing plate 16, each shim 52 is removably fixed to the reinforcing plate 16 together with the reference plate 42 between the bottom surface 44a of the reinforcing plate 16 and the reference plane 42a of the reference plate 42.

The bolt 46 integrally combines the reinforcing plate 16, the wiring base plate 14, and the probe base plate 18 with one another by the cylindrical spacer 50 screwed by the bolt and the anchor portion 32 of the probe base plate 18 screwed by the cylindrical spacer. Also, in the example illustrated in FIG. 1, the reinforcing plate 16 and the wiring base plate 14 are combined by a plurality of screw members 56, and an edge portion of the probe base plate 18 is supported on a conventionally well-known fixing ring member 58 adapted to receive the edge portion. The fixing ring member 58 is combined with the wiring base plate 14 by screw members 60 passing through the wiring base plate 14 and screwed at tip ends thereof into the reinforcing plate 16. The reinforcing plate 16 and the wiring base plate 14 are integrally combined by the screw members 60 for the fixing ring member 58 as well.

The electrical connecting apparatus 10 is used with the lower surface 14a of the wiring base plate 14 mounted on an edge portion upper surface 12a of the card holder 12 as illustrated in FIG. 1. When the probe tips 30a of the respective probes 30 contact the corresponding electrodes 7a of the device under test 7 as illustrated in FIG. 5 in a state in which the electrical connecting apparatus 10 is mounted on the card holder 12, the electrodes are connected from the sockets to the main body of the tester via the conductive paths of the probe base plate 18, the pogo pin assembly 20, and the conductive paths of the wiring base plate 14.

Each cylindrical spacer 50 incorporated in the electrical connecting apparatus 10 appropriately maintains a distance from the reference plane 42a of the reference plate 42 on which the upper end surface of the cylindrical spacer 50 abuts to the anchor portion 32 on which the lower end surface of the cylindrical spacer abuts so that the respective probes 30 may contact the corresponding electrodes 7a with appropriate thrusting forces in a use state of the electrical connecting apparatus 10. Also, each shim 52 is used for adjustment of inclination of the reference plane 42a caused by a manufacturing error of the reinforcing plate 16 and for fine adjustment of the aforementioned distance.

Figure 3:
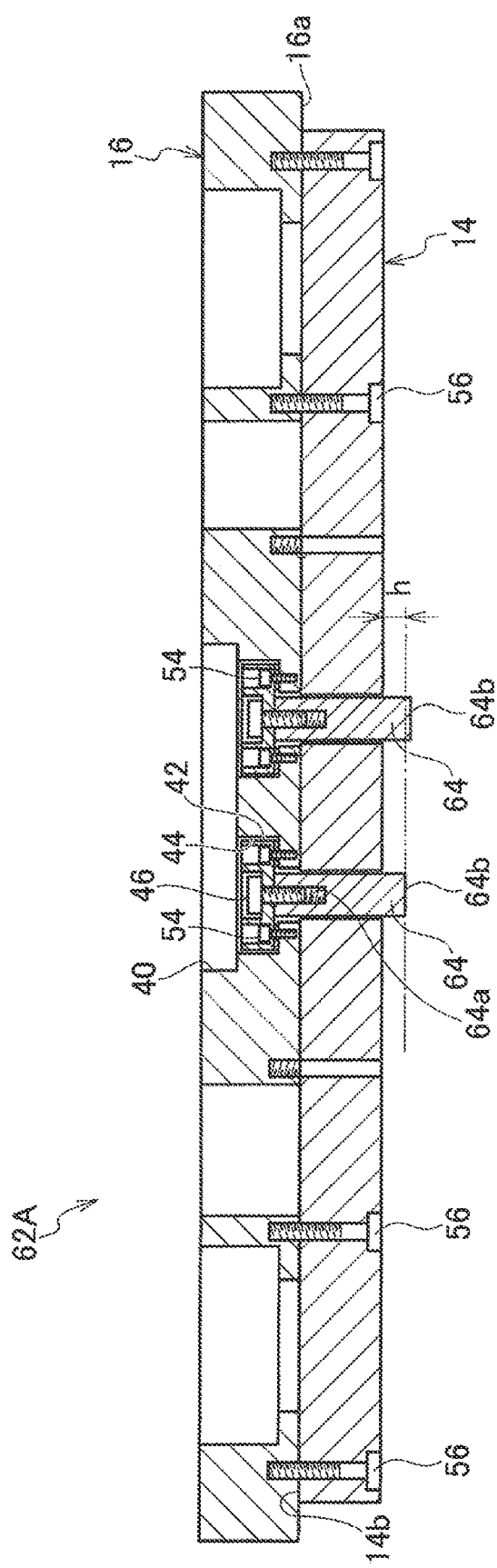
FIG. 3 is a cross-sectional view illustrating an assembling process of a wiring base plate gathering portion of the electrical connecting apparatus illustrated in FIG. 1.

Hereinafter, a method for assembling the electrical connecting apparatus 10 will be described with reference to FIG. 3 and FIG. 4. In the example illustrated in FIG. 3, each reference plate 42 is fixed in the opening 44 of the reinforcing plate 16 by the screw members 54, and the shim 52 having a predetermined thickness is provided between each reference plate 42 and the bottom surface 44a of the opening 44 as described above.

Also, the upper surface 14b of the wiring base plate 14 abuts on the lower surface 16a of the reinforcing plate 16, and the plates 16 and 14 are fixed by the screw members 56, which causes a wiring base plate gathering portion 62A to be formed.

In this wiring base plate gathering portion 62A are incorporated cylindrical standard spacer members or standard cylindrical spacers 64 each having a predetermined length dimension. At one end of each standard cylindrical spacer 64 is formed a screw groove 64a similar to the screw groove 50a allowing the shaft portion 46b of the bolt 64 to be screwed therein. A lower end of the standard cylindrical spacer 64 is a flat surface 64b. In a state in which the standard cylindrical spacer 64 receives the shaft portion 46b of the bolt 46 in the screw groove 64a thereof, the bolt 46 is tightened to the standard cylindrical spacer 64 with appropriate tightening torque.

Thereafter, respective heights h from the flat surfaces 64b of the respective standard cylindrical spacers 64 to the lower surface 14a of the wiring base plate 14 are measured. When the height positions (h) of the flat surfaces 64b vary, thickness dimensions of the respective shims 52 are selected so that the flat surfaces 64b of all the standard cylindrical spacers 64 may correspond to the lowermost flat surface 64b.

Alternatively, the thickness dimensions of the respective shims 52 may be selected so that the flat surfaces 64b of all the standard cylindrical spacers 64 may correspond to the uppermost flat surface 64b. What is important is that the flat surfaces 64b of all the standard cylindrical spacers 64 correspond on a flat surface.

Accordingly, even in a case where no shim 52 having a predetermined thickness is provided between the reference plate 42 and the reinforcing plate 16, and where the reference plate 42 and the reinforcing plate 16 abut on each other directly, the shim 52 having an appropriate thickness dimension can be provided by attachment and detachment of the screw members 54 as needed so that the flat surfaces 64b of all the standard cylindrical spacers 64 may correspond to the uppermost flat surface 64b, for example, in a similar manner.

For selection of the thickness dimensions of the shims 52, one shim 52 having an appropriate thickness dimension to eliminate variation in height positions of the flat surfaces 64b of the standard cylindrical spacers 64 can be selected per reference plate 42. Alternatively, the plurality of shims 52 having an appropriate total thickness dimension to eliminate the variation can be piled and used per reference plate 42. The shims 52 can also be used for fine adjustment of a distance l from the lower surface 14a of the wiring base plate 14 to the virtual plane on which the probe tips 30a of the probes 30 are located.

After the shims 52 are adjusted to align the flat surfaces 64b of all the standard cylindrical spacers 64, and the screw members 54 are tightened, the standard cylindrical spacers 64 are detached from the respective bolts 46.

Figure 4:
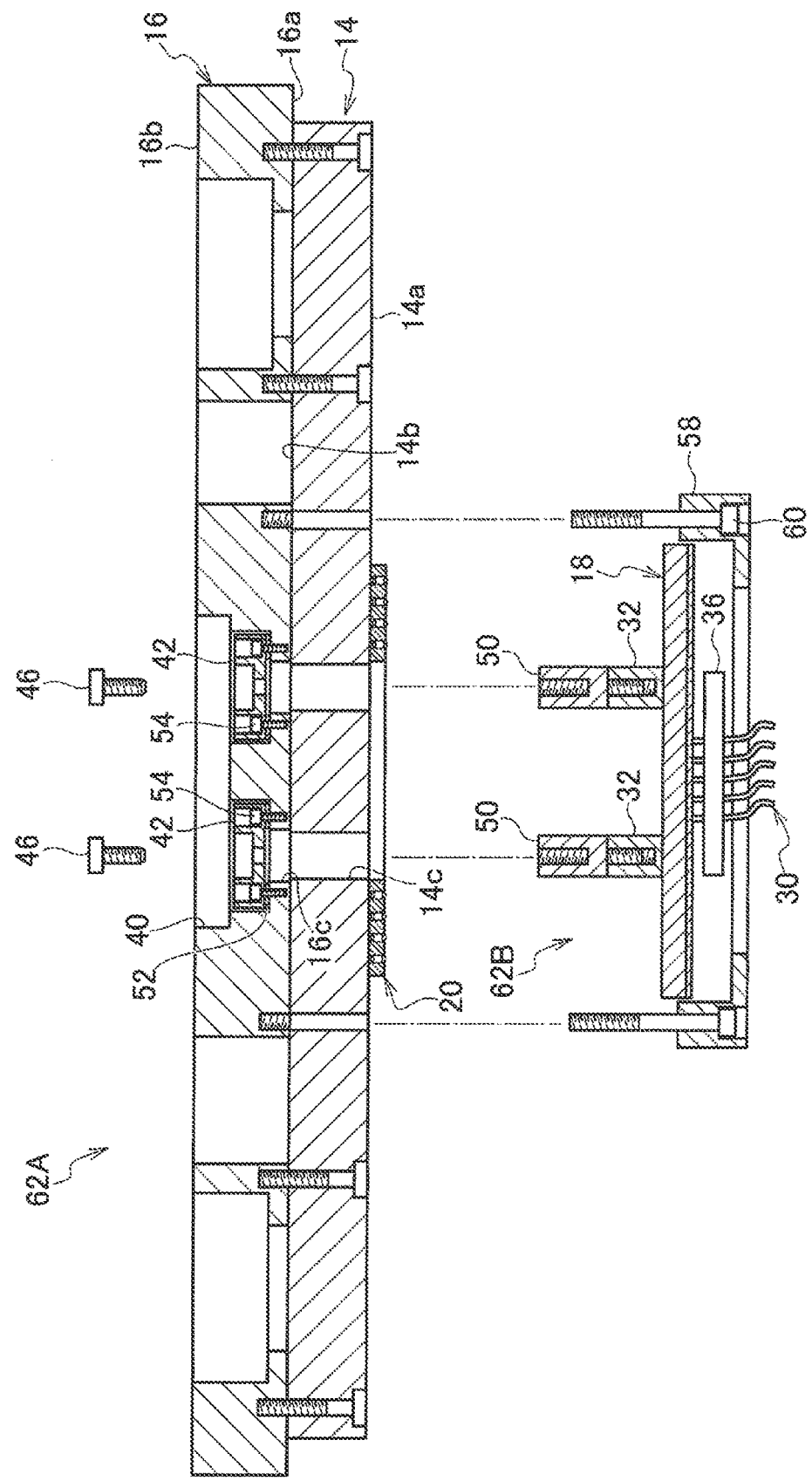
FIG. 4 is a cross-sectional view illustrating a combining process of the wiring base plate gathering portion illustrated in FIG. 3 with a probe base plate gathering portion.

After detachment of the standard cylindrical spacers 64, the elastic connector 20 made of a pogo pin assembly is attached to the lower surface 14a of the wiring base plate 14 of the wiring base plate gathering portion 62A in a similar manner to that in a conventional case as illustrated in FIG. 4.

Also, in the respective anchor portions 32 of the probe base plate 18 having the probes 30 held in the holder 36 are screwed the male screw portions 50b of the cylindrical spacers 50 each having an after-mentioned appropriate length dimension, which causes a probe base plate gathering portion 62B to be formed.

The probe base plate gathering portion 62B is combined with the wiring base plate gathering portion 62A as the respective cylindrical spacers 50 are inserted in the corresponding through holes 14c of the wiring base plate 14 and the corresponding through holes 16c of the reinforcing plate 16, and as the shaft portions 46b of the corresponding bolts 46 are screwed via the center openings 48a of the reference plates 42 into the screw grooves 50a of the respective cylindrical spacers 50. Also, the fixing ring member 58 is screwed shut via the wiring base plate 14 to the reinforcing plate 16, and thus the electrical connecting apparatus 10 is assembled.

The cylindrical spacers 50 to be used at the time of assembling the electrical connecting apparatus 10 are basically selected based on the height dimensions of the aforementioned standard cylindrical spacers 64.

That is, each cylindrical spacer 50 is selected so that the sum of the height dimension of the anchor portion 32 and the length dimension of the cylindrical spacer 50 corresponding to the anchor portion may be equal to the height dimension of the standard cylindrical spacer 64.

For example, in a case where the probe tips 30a of the respective probes 30 are aligned on an equal virtual plane in a state in which warpage or wave-like deformation is introduced in the probe base plate 18, by selecting each cylindrical spacer 50 so that the sum of the length dimension of each cylindrical spacer 50 and the height dimension of the corresponding anchor portion 32 may be equal to the height dimension of the standard cylindrical spacer 64, the probe tips 30a of the probes 30 can be aligned on the virtual plane P illustrated in FIG. 1 in a state in which warpage or wave-like deformation of the probe base plate 18 is held.

Also, as long as the probe tips 30a of the probes 30 are aligned on an equal plane, even in a case where height variation exists among the plurality of anchor portions 32, by selecting the length of the cylindrical spacer 50 corresponding to each anchor portion so that the sum of the height of each anchor portion 32 and the height of the cylindrical spacer 50 corresponding to the anchor portion may be equal to the height dimension of the standard cylindrical spacer 64, the probe tips 30a of the probes 30 can be aligned on the appropriate equal plane P.

As described above, with the electrical connecting apparatus 10 according to the embodiment, the respective shims 52 can be set appropriately based on measurement values of the flat surfaces 64b of the standard cylindrical spacers 64 not by trial and error with use of the standard cylindrical spacers 64 having predetermined lengths regardless of thickness variation of the wiring base plate 14 caused by a manufacturing error.

Also, since the shims 52, which have been set appropriately, are held to the reinforcing plate 16 reliably together with the reference plates 42 by means of the screw members 54, the reference planes 42a of the reference plates 42 are held with respect to the wiring base plate 14 even in a case where the probe base plate gathering portion 62B is detached from the wiring base plate gathering portion 62A as illustrated in FIG. 4.

Accordingly, as described above, even in a case where the probe base plate 18 including a defective probe 30 is to be replaced with a new probe base plate 18, conventional resetting of the shims is not needed. Also, in combining a new probe base plate gathering portion 62B formed by attaching the cylindrical spacers 50 to the anchor portions 32 of this new probe base plate 18 with the wiring base plate gathering portion 62A, appropriate cylindrical spacers 50 can be selected based on the length dimensions of the standard cylindrical spacers 64 and the height dimensions of the respective corresponding anchor portions 32 without the need for conventional trial and error selection. Thus, the user does not need to return the defective electrical connecting apparatus 10 to the manufacturer and can reassemble the electrical connecting apparatus 10 in which the probe tips 30a of the probes 30 are aligned on the appropriate virtual plane P relatively easily without a conventional trial and error setting work of the shims 52 and the cylindrical spacers 50.

Also, in the electrical connecting apparatus 10 according to the embodiment, since partial variation in thickness dimension of the wiring base plate 14 and variation in thickness dimension per wiring base plate 14 due to a manufacturing error can be compensated by selection of the thickness dimensions of the respective shims 52, the more accurate electrical connecting apparatus 10 can be manufactured.

In the foregoing description, an example of using an elastic connector made of the pogo pin assembly 20 as the interposer has been shown. However, the embodiment is not limited to this, and various elastic connectors such as a conventionally well-known elastic wire connector can be used. Also, the embodiment can be applied to an electrical connecting apparatus that dispenses with the elastic connector 20.

The described subject matter is not limited to the above embodiments but may be altered in various ways without departing from the spirit and scope presented here.

What is claimed is:

1. An electrical connecting apparatus comprising:
   a reinforcing plate having a first surface and a second surface opposed to each other;
   a wiring base plate having a first surface, a second surface and a plurality of first electrical connection portions provided on the second surface of the wiring base plate, said wiring base plate being coupled with the reinforcing plate so that the first surface of the wiring base plate abuts on the first surface of the reinforcing plate;
   a probe base plate having a first surface opposed to the second surface of the wiring base plate, a second surface, second electrical connection portions and multiple probes, the second electrical connection portion being provided on the first surface of the probe base plate and corresponding to the first electrical connection portions, the multiple probes, respectively, being electrically connected to the second electrical connection portions;
   a plurality of anchor portions respectively formed in an area of the first surface of the probe base plate not provided with the second electrical connection portions and respectively provided with screw holes to be opened to top surfaces thereof;
   a plurality of through holes formed respectively in the wiring base plate and the reinforcing plate to correspond to the respective anchor portions to be aligned with each other in plate thickness directions of the wiring base plate and the reinforcing plate;
   a plurality of cylindrical spacers respectively having first ends thereof removably screw-coupled with the top surfaces of the respective corresponding anchor portions, respectively having screw grooves formed on inner circumferential surfaces of second ends thereof, and respectively arranged in the through holes of the wiring base plate and the reinforcing plate;
   a plurality of reference plates arranged on the second surface of the reinforcing plate to correspond to the respective cylindrical spacers, respectively having reference planes adapted to receive the second ends of the respective corresponding cylindrical spacers on surfaces thereof opposed to the second surface of the reinforcing plate, and respectively removably coupled with the reinforcing plate via screw members;
   a plurality of shims inserted between the respective reference plates and the reinforcing plate; and
   at least one bolt having a head portion mounted on a second surface of the reference plate and a shaft portion passing through the reference plate and the corresponding shim from the head portion and having a tip end portion thereof screwed in the screw groove of the cylindrical spacer.

2. The electrical connecting apparatus according to claim 1, wherein the shims undergo selection of each thickness dimension thereof or a piling count for fine adjustment of a distance from the first surface of the wiring base plate to a virtual plane on which probe tips of the probes are located and correction of inclination of the virtual plane with respect to an upper surface of a card holder.

3. The electrical connecting apparatus according to claim 1, wherein the first end of the cylindrical spacer is provided with a male screw portion projecting from an end surface thereof in an axial direction of the cylindrical spacer, and the male screw portion is screwed in the screw hole of the corresponding anchor portion so as to allow the end surface to abut on the top surface of the anchor portion.

4. The electrical connecting apparatus according to claim 1, wherein between the second surface of the wiring base plate and the first surface of the probe base plate is inserted an elastic connector adapted to electrically connect the mutually corresponding first and second electrical connection portions.

5. The electrical connecting apparatus according to claim 2, wherein in the probe base plate is introduced deformation in a thickness direction thereof, the probe tips of the probes are arranged on the virtual plane in a state of holding the deformation of the probe base plate, and the cylindrical spacers hold the deformation of the probe base plate in cooperation with the anchor portions so as to hold the probe tips of the probes on the virtual plane.

* * * * *